(12) United States Patent
Manku et al.

(10) Patent No.: US 6,727,764 B2
(45) Date of Patent: Apr. 27, 2004

(54) GENERATION OF VIRTUAL LOCAL OSCILLATOR INPUTS FOR USE IN DIRECT CONVERSION RADIO SYSTEMS

(75) Inventors: Tajinder Manku, Kitchener (CA); Stephen Arnold Devison, Waterloo (CA); Christopher E. Snyder, Waterloo (CA)

(73) Assignee: SiRiFIC Wireless Corporation, Waterloo (CA)

( * ) Notice: Subject to any disclaimer, the term of this patent is extended or adjusted under 35 U.S.C. 154(b) by 0 days.

(21) Appl. No.: 10/096,147

(22) Filed: Mar. 8, 2002

(65) Prior Publication Data

US 2003/0169116 A1 Sep. 11, 2003

(51) Int. Cl.$^7$ ................................................. H03B 1/00
(52) U.S. Cl. .......................... 331/57; 331/1 A; 327/158; 327/161
(58) Field of Search ................... 331/57, 1 A; 327/158, 327/159, 161, 295, 149, 152, 153

(56) References Cited

U.S. PATENT DOCUMENTS

| | | | | |
|---|---|---|---|---|
| 5,260,608 A | * | 11/1993 | Marbot | ........................ 327/261 |
| 5,451,911 A | * | 9/1995 | Colvin et al. | .................. 331/57 |
| 5,463,337 A | * | 10/1995 | Leonowich | .................. 327/158 |
| 5,619,170 A | * | 4/1997 | Nakamura | .................. 331/1 A |
| 6,337,601 B1 | * | 1/2002 | Klemmer | ..................... 331/34 |
| 6,426,662 B1 | * | 7/2002 | Arcus | ........................ 327/295 |

FOREIGN PATENT DOCUMENTS

WO  WO 01/17122 A1  3/2001

OTHER PUBLICATIONS

"Merged Phase–Locked Loop and Frequency–Chopper", IBM_TDB, vol. 36, No. 11, Nov. 1993, pp. 151–152.*

* cited by examiner

Primary Examiner—Tuan T. Lam
(74) Attorney, Agent, or Firm—Gardner Groff, P.C.

(57) ABSTRACT

The invention provides a system and method of generating a number of inputs to the mixer elements in a direct conversion (homodyne) receiver configuration using Virtual Local Oscillator (VLO) techniques. These generated inputs meet the requirement that they must have a fixed and stable phase-relationship, as well as being correctly related in terms of their power spectra relative to the operating radio (RF), intermediate (IF), and baseband frequencies of the system, and that when applied to the mixer elements they permit the mixer elements to create internally the effect of applying the Local Oscillator signal at a suitable frequency.

17 Claims, 5 Drawing Sheets

GENERATION OF VIRTUAL LOCAL OSCILLATOR INPUTS FOR USE IN DIRECT CONVERSION RADIO SYSTEMS

BACKGROUND OF THE INVENTION

The present invention relates generally to communications, and more specifically to up-conversion and down-conversion, being a frequency generation device providing waveforms for use in a Virtual Local Oscillator-base system.

Many communication systems up-convert electromagnetic signals from baseband to higher frequencies for transmission, and subsequently down-convert those high frequencies back to their original frequency band when they reach the receiver, processes known as up-conversion and down-conversion (or modulation and demodulation) respectively. The original (or baseband) signal, may be, for example, data, voice or video. These baseband signals may be produced by transducers such as microphones or video cameras, be computer generated, or transferred from an electronic storage device. In general, the high frequencies provide longer range and higher capacity channels than baseband signals, and because high frequency radio frequency (RF) signals can propagate through the air, they can be used for wireless transmissions as well as hard wired or fibre channels.

All of these signals are generally referred to as radio frequency (RF) signals, which are electromagnetic signals; that is, waveforms with electrical and magnetic properties within the electromagnetic spectrum normally associated with radio wave propagation.

Wired communication systems which employ such modulation and demodulation techniques include computer communication systems such as local area networks (LANs), point to point signalling, and wide area networks (WANs) such as the Internet. These networks generally communication data signals over electrically conductive or optical fibre channels. Wireless communication systems which may employ modulation and demodulation include those for public broadcasting such as AM and FM radio, and UHF and VHF television. Private communication systems may include cellular telephone networks, personal paging devices, HF (high frequency) radio systems used by taxi services, microwave backbone networks, interconnected appliances under the Bluetooth standard, and satellite communications. Other wired and wireless systems which use RF up-conversion and down-conversion would be known to those skilled in the art.

For cellular telephones, for example, it is desirable to have transmitters and receivers (which may be referred to in combination as a transceiver) which can be fully integrated onto inexpensive, low power, integrated circuits (ICs).

As frequencies of interest in the wireless telecommunications industry (especially low-power cellular/microcellular voice/data personal communications systems) have risen above those used previously (approximately 900 MHz) into the 1 GHz–5 GHz spectrum, the desire to implement low-cost, power efficient receivers and transmitters has led to intensive research into the use of highly integrated designs, an increasingly important aspect for portable systems, including cellular telephone handsets.

Several attempts at completely integrated transceiver designs have met with limited success. Other RF receiver topologies exist, such as image rejection architectures, which can be completely integrated on a chip, but lack in overall performance. Although many receivers use the "super-heterodyne" topology, which provides excellent performance, this does not meet the desired level of integration for modern wireless systems.

Direct conversion architectures demodulate RF signals to baseband in a single step, by mixing the RF signal with a local oscillator signal at the carrier frequency of the RF signal. There is therefore no image frequency, and no image components to corrupt the signal. Direct-conversion receivers offer a high level of integratability, but also have several important problems. Hence, direct conversion receivers have thus far proved useful only for signalling formats that do not place appreciable signal energy near DC after conversion to baseband.

A typical direct conversion or homodyne receiver is shown in FIG. 1. The RF band pass filter (BPF1) 102 first filters the signal coming from the antenna 100 (this band pass filter 102 may also be a duplexer). A low noise amplifier 104 is then used to amplify the filtered antenna signal, increasing the strength of the RF signal and reducing the noise figure of the receiver.

The signal is then split into its quadrature components and down-converted to baseband in a single stage using mixers MI 110 and MQ 120, and orthogonal signals generated by local oscillator (LO) 132 and 90 degree phase shifter 130. LO 132 generates a regular, periodic signal which is tuned to the carrier frequency of the incoming wanted signal rather than a frequency offset from the carrier as in the case of the super-heterodyne receiver. The signals coming from the outputs of MI 110 and MQ 120 are now at baseband, that is, having a carrier frequency of 0 Hz. The two signals are next filtered using low pass filters LPFI 112 and LPFQ 122, are amplified by gain-controlled amplifiers AGCI 114 and AGCQ 124, and are digitized via analog to digital converters ADI 116 and ADQ 126.

Direct conversion RF receivers as illustrated in FIG. 1 have several advantages over super-heterodyne systems in terms of cost, power consumption, and level of integration, however, there are also several serious problems with direct conversion. These problems include:

noise near baseband (that is, 1/f noise) which corrupts the desired signal. The term "1/f noise" is used to describe a number of types of noise that are greater in magnitude at lower frequencies than at higher frequencies (typically, their magnitude increases roughly with the inverse of the signal frequency);

local oscillator (LO) leakage in the RF path that creates DC offsets in the down-converted (base-band) output signal. As the LO frequency is the same as the incoming signal being demodulated, any leakage of the LO signal through the mixers 110, 120 to their RF port will fall directly into the desired signal's band and be down-converted to baseband as well;

local oscillator (LO) leakage into the RF path that causes desensitization. Desensitization is the reduction of desired signal gain as a result of receiver reaction to an undesired signal. The gain reduction is generally due to overload of some portion of the receiver, such as the AGC circuitry 40, 42 resulting in suppression of the desired signal because the receiver will no longer respond linearly to incremental changes in input voltage.

noise inherent to mixed-signal integrated circuits corrupts the desired signal; and large on-chip capacitors used as high-pass filters are required to remove unwanted noise and signal energy near DC, which makes integratability expensive. These capacitors are typically placed between the mixers 114, 116 and the low pass filters 136, 138.

What is needed is a simpler and more satisfactory means of generating the signals required for certain Local Oscillator implementations.

BRIEF SUMMARY OF THE INVENTION

The invention provides a simplified and effective system and method for generating a number of inputs to the mixer elements of a direct conversion (homodyne) receiver configuration which uses certain Local Oscillator techniques.

In this regard, Virtual Local Oscillators are used to provide the equivalent of a local oscillator without using frequency generators having significant spectral components (power) in the input frequency or intermediate frequencies of the receiver circuit, thereby mitigating some of the disadvantages listed above. Our co-pending PCT application (WO0117122: Improved Method and Apparatus for Up- and Down-Conversion of Radio Frequency (RF) Signals, LING, YANG (CA); WONG, LAWRENCE (CA); MANKU, TAJINDER (CA).) describes preferred implementations and relevant sections are included in the detailed description for ease of reference.

In the implementation of a system using a Virtual Local Oscillator, the circuit that generates the various time-varying signals or waveforms required to operate the VLO invention presents significant design challenges. Designs have been produced which are sufficient to serve the purpose, but they tend to be complex and have higher power consumption.

The circuit that generates the various time-varying signals or waveforms are required to have a fixed and stable phase-relationship, as well as being correctly related in terms of their power spectra relative to the operating radio (RF), intermediate (IF), and baseband frequencies of the system. Such waveforms, when applied to the mixer, permit the mixer to create internally the effect of applying the Local Oscillator signal at the required frequency.

BRIEF DESCRIPTION OF DRAWINGS

Preferred embodiments will be described with reference to the following figures.

DETAILED DESCRIPTION OF THE INVENTION

Since it is helpful to have some understanding of the concepts of a Virtual Local Oscillator system, we have for completeness, incorporated a brief description of the Virtual Local Oscillator, the subject of a co-pending PCT application (WO0117122: Improved Method and Apparatus for Up- and Down-Conversion of Radio Frequency (RF) Signals, LING, YANG (CA); WONG, LAWRENCE (CA); MANKU, TAJINDER (CA)).

The Virtual Local Oscillator is concerned with the generation of signals used in the conversion process which have properties that solve the image-rejection problems associated with heterodyne receivers and transmitters and the LO-leakage and 1/f noise problems associated with direct conversion receivers and transmitters.

Figure 1:
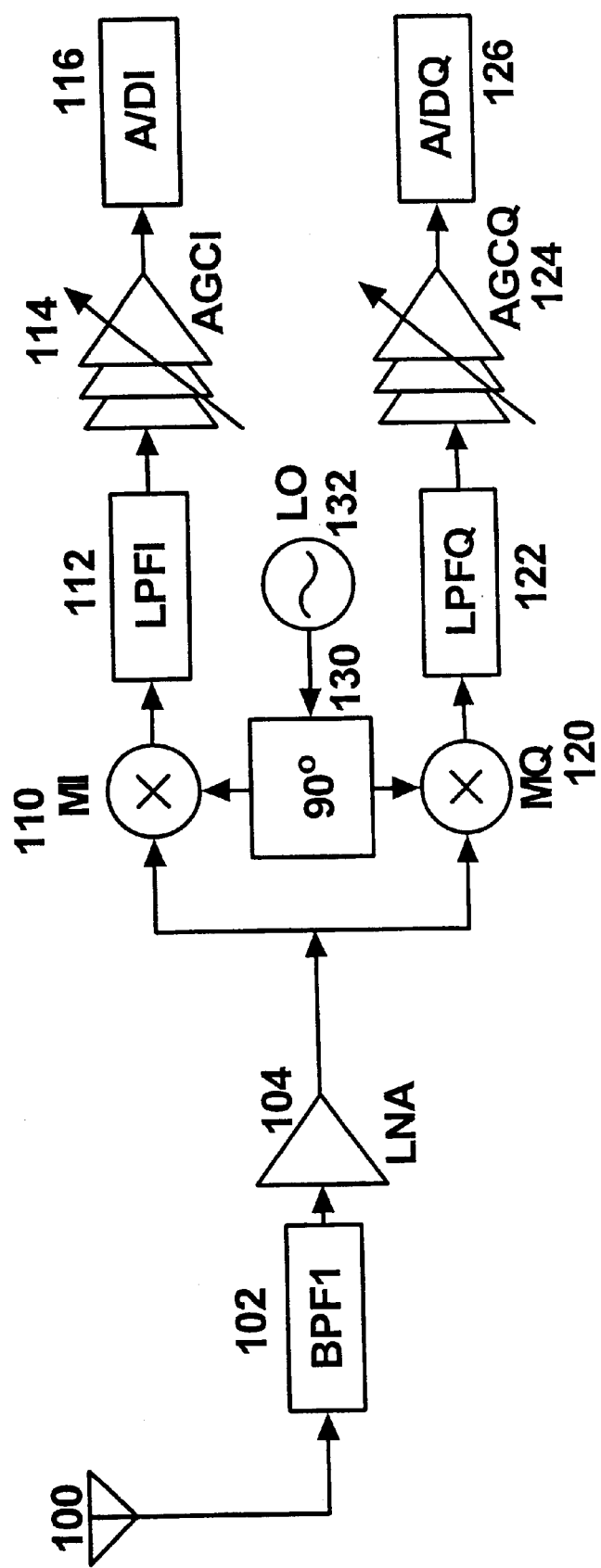
FIG. 1 represents a typical receiver architecture of a direct conversion or homodyne receiver as known in prior art.
Figure 2A:
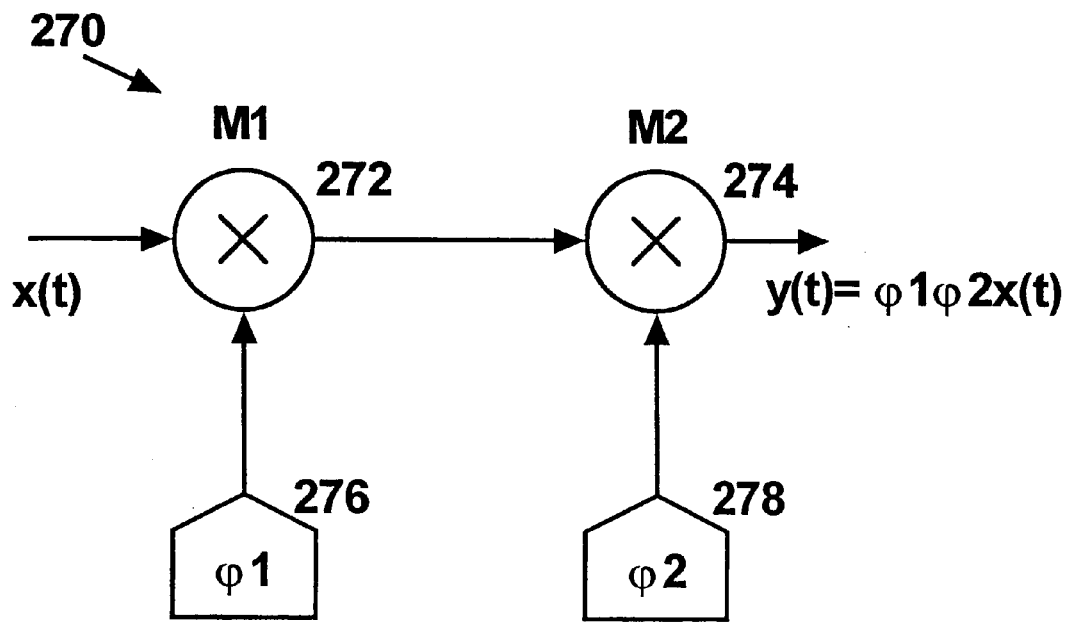
FIGS. 2A and 2B illustrate the Virtuat Local Oscillator concept for which the invention is suited.

A circuit which addresses the problems outlined above, is presented as a block diagram in FIG. 2A. This figure presents a balanced modulator or demodulator 270 in which an input signal x(t) is mixed with two synthesized signals (labelled $\phi 1$ and $\phi 2$) which are irregular and vary in the time domain, to effect the desired modulation or demodulation. The two mixers M1 272 and M2 274 are standard mixers known in the art, having the typical properties of an associated noise figure, linearity response, and conversion gain. The selection and design of these mixers would follow the standards known in the art, and could be, for example, double balanced mixers. Although this figure implies various elements are implemented in analogue form they can be implemented in digital form.

The two synthesizers 276 and 278 generate two time-varying functions $\phi 1$ and $\phi 2$ that mixed together within the mixer circuit comprise a virtual local oscillator (VLO) signal. These two functions have the properties that their product emulates a local oscillator (LO) signal that has significant power at the carrier frequency, but neither of the two signals has a significant level of power at the frequency of the LO being emulated. As a result, the desired modulation or demodulation is affected, but there is no LO signal to leak into the RF path.

The representation in FIG. 2A is exemplary, as any two-stage or multiple stage mixing architecture may be used to implement the invention. As well, the synthesizer for generating the time-varying mixer signals $\phi 1$ and $\phi 2$ may comprise a single device, or multiple devices.

In current receiver and transmitter technology, frequency translation of an RF signal to and from baseband is performed by multiplying the input signal by regular, periodic, sinusoids. If one multiplication is performed, the architecture is said to be a direct-conversion or homodyne architecture, while if more than one multiplication is performed the architecture is said to be a heterodyne or super-heterodyne architecture. Direct-conversion transceivers suffer from LO leakage and 1/f noise problems which limit their capabilities, while heterodyne transceivers require image-rejection techniques which are difficult to implement on-chip with high levels of performance.

The problems of image-rejection, LO leakage and 1/f noise in highly integrated transceivers can be overcome by using more complex signals than simple, regular, periodic, sinusoids in the frequency translation process. These signals have tolerable amounts of power at the RF band frequencies both in the signals themselves and in any other signals produced during their generation.

The preferred criteria for selecting such functions $\phi 1$ and $\phi 2$ are:

(i) for the signal x(t) to be translated to baseband, $\phi 1(t) * \phi 2(t)$ must have a frequency component at the carrier frequency of x(t);

(ii) in order to minimize spurious response problems, $\phi 1(t) * \phi 2(t)$ must have less than a tolerable amount energy at frequencies other than the carrier frequency of x(t) or at least far enough away that these image frequencies can be significantly filtered on-chip prior to down-conversion;

(iii) in order to minimize LO leakage problems, the signals $\phi 1$ and $\phi 2$ must not have significant amounts of power in the RF output signal bandwidth. That is, the amount of power generated at the output frequency should not effect the overall system performance of the transmitter or receiver in a significant manner;

(iv) also to avoid LO leakage found in conventional direct conversion and directly modulated topologies, the signals required to generate φ1 and φ2, or the intermediate signals which occur, should not have a significant amount of power at the output frequency;

(v) φ2*φ2 (sometimes written simply φ2φ2) should not have a significant amount of power within the bandwidth of the up-converted RF (output) signal. This ensures that if φ1 leaks into the input port, it does not produce a signal within the RF signal at the output. It also ensures that if φ2 leaks into node between the two mixers, it does not produce a signal within the RF signal at the output; and (vi) if x(t) is an RF signal, φ1*φ1*φ2 should not have a significant amount of power within the bandwidth of the RF signal at baseband. This ensures that if φ1 leaks into the input port, it does not produce a signal within the baseband signal at the output.

These signals can, in general, be random, pseudo-random, or periodic functions of time, and may be either analogue, or digital time-varying signals or waveforms.

It would be clear to one skilled in the art that virtual LO signals may be generated which provide the benefits of the invention to greater or lesser degrees. While it is possible in certain circumstances to have almost no LO leakage, it may be acceptable in other circumstances to incorporate virtual LO signals which still allow a degree of LO leakage.

Figure 2B:
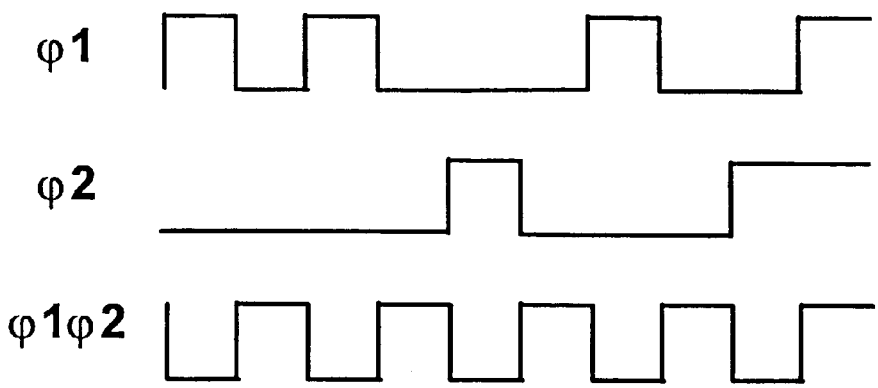

An exemplary set of acceptable waveforms is presented in FIG. 2B, plotted in amplitude versus time. Five cycles of the VLO signal are presented, labelled φ1φ2. It is important to note that at no point in the operation of the circuit is an actual φ1φ2 signal ever generated; the mixers receive separate φ1 and φ2 signals, and mix them with the input signal using different physical components. Hence, there is no LO signal which may leak into the circuit. The states of these φ1 and φ2 signals with respect to the hypothetical φ1φ2 output are as follows:

| φ1φ2 | φ1 | φ2 |
|---|---|---|
| Cycle 1-LO | HI | LO |
| Cycle 1-HI | LO | LO |
| Cycle 2-LO | HI | LO |
| Cycle 2-HI | LO | LO |
| Cycle 3-LO | LO | HI |
| Cycle 3-HI | LO | LO |
| Cycle 4-LO | HI | LO |
| Cycle 4-HI | LO | LO |
| Cycle 5-LO | LO | HI |
| Cycle 5-HI | HI | HI |

While these signals may be described as "aperiodic", groups of cycles may be repeated successively. For example, the pattern of the φ1 and φ2 input signals presented in FIG. 2B which generate the φ1φ2 signal, repeat with every five cycles. Longer cycles could certainly be used.

It would be clear to one skilled in the art that many additional pairings of signals may also be generated. The more thoroughly the above criteria (i)–(vi) for selection of the of the φ1 and φ2 signals are complied with, the more effective the invention will be in overcoming the problems in the art.

The topology of the virtual local oscillator is similar to that of other two stage or multistage modulators and demodulators, but the use of irregular, time-varying mixer signal provides fundamental advantages over known transmitters and receivers, including:

minimal 1/f noise;

minimal imaging problems;

minimal leakage of a local oscillator (LO) signal into the RF output band;

removes the necessity of having a second LO and various (often external) filters; and has a higher level of integration as the components it does require are easily placed on an integrated circuit. For example, no large capacitors or sophisticated filters are required.

Since the mixers in most transceivers act as solid state switches being turning on and off, it is preferable to drive the mixers using square time-varying signals or waveforms rather than sinusoids. Square time-varying signals or waveforms with steep leading and trailing edges will switch the state of the mixers more quickly, and at a more precise moment in time than sinusoid waveforms.

Figure 3:
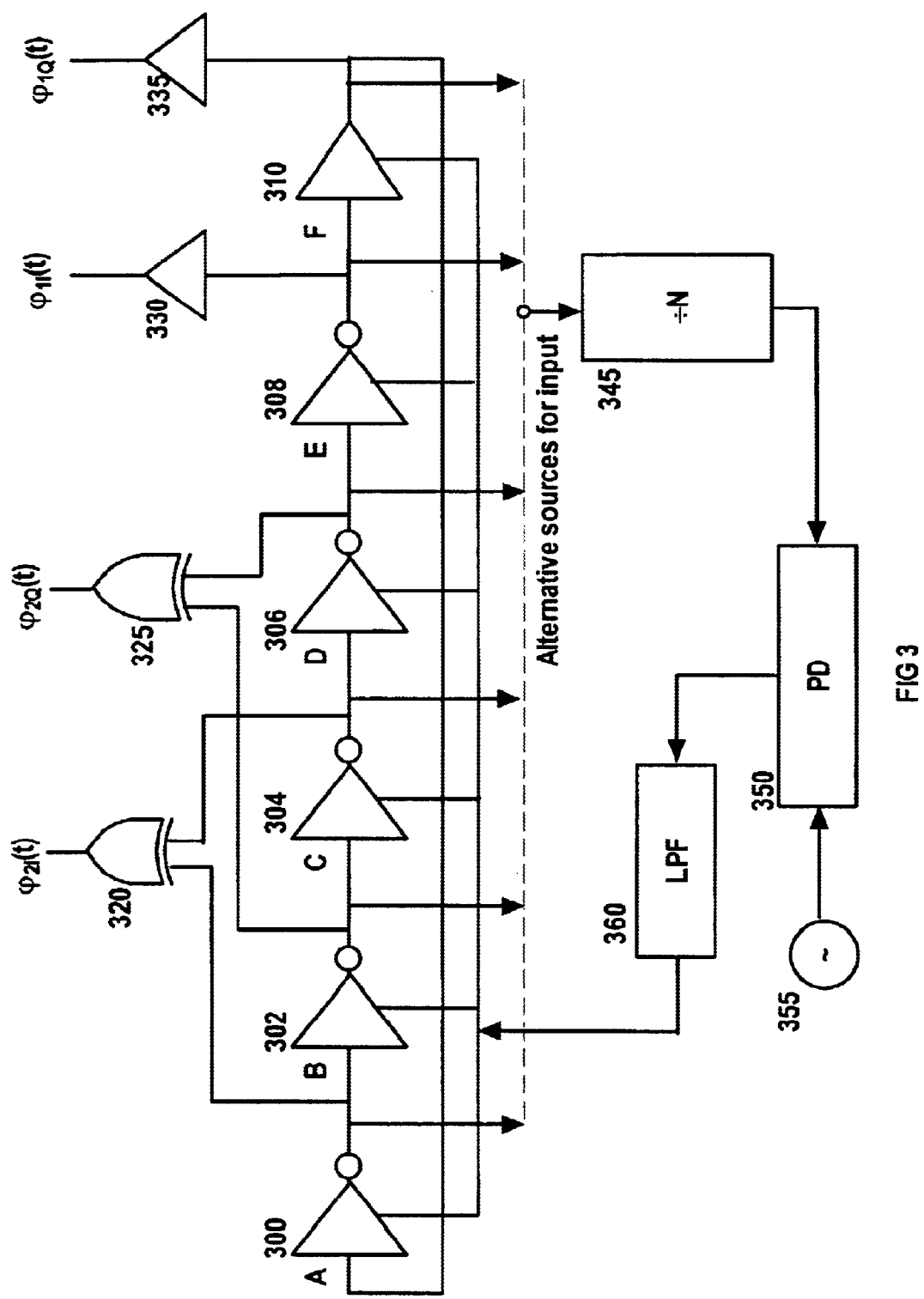
FIG. 3 is a diagram of a preferred embodiment of the invention.
Figure 4:
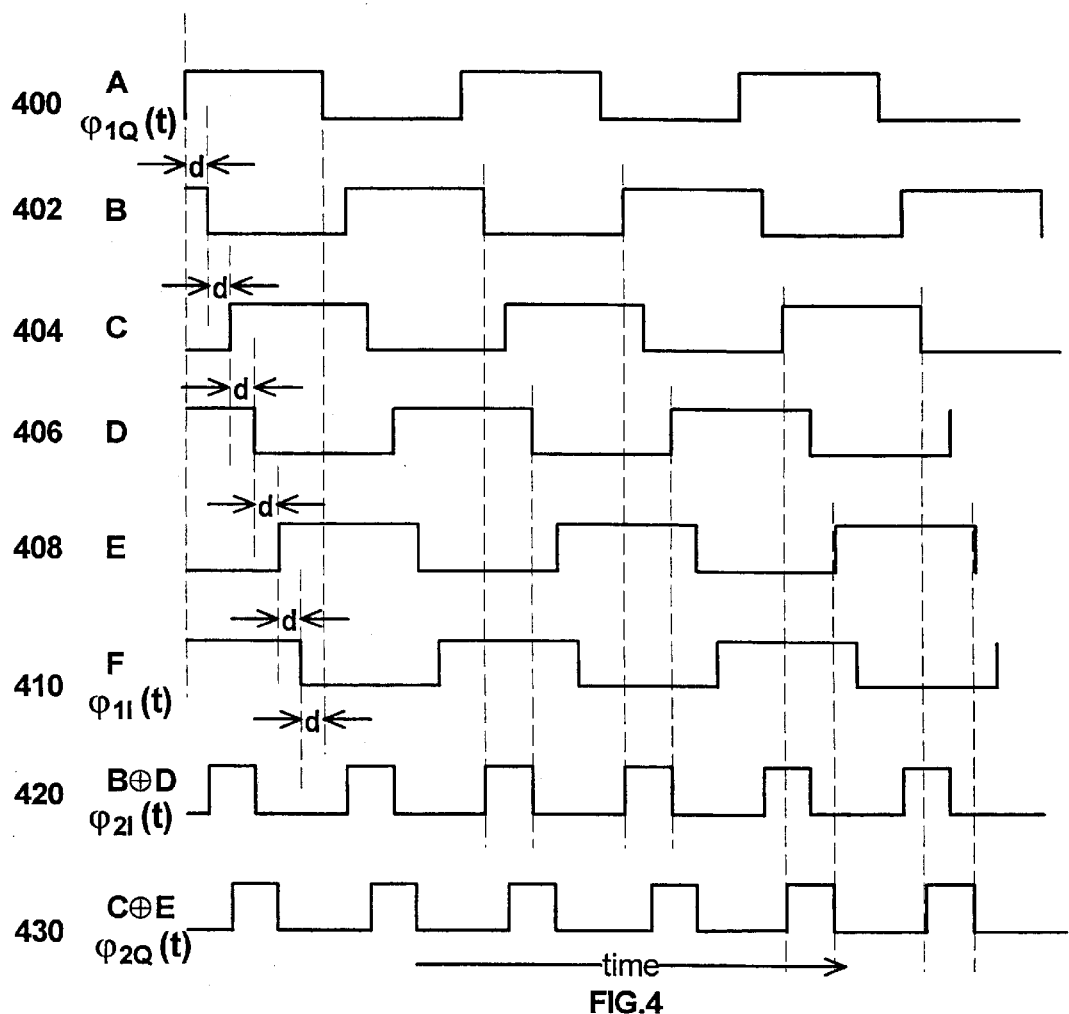
FIG. 4 illustrates the various time-varying signals or waveforms produced from the circuit of FIG. 3.
Figure 5:
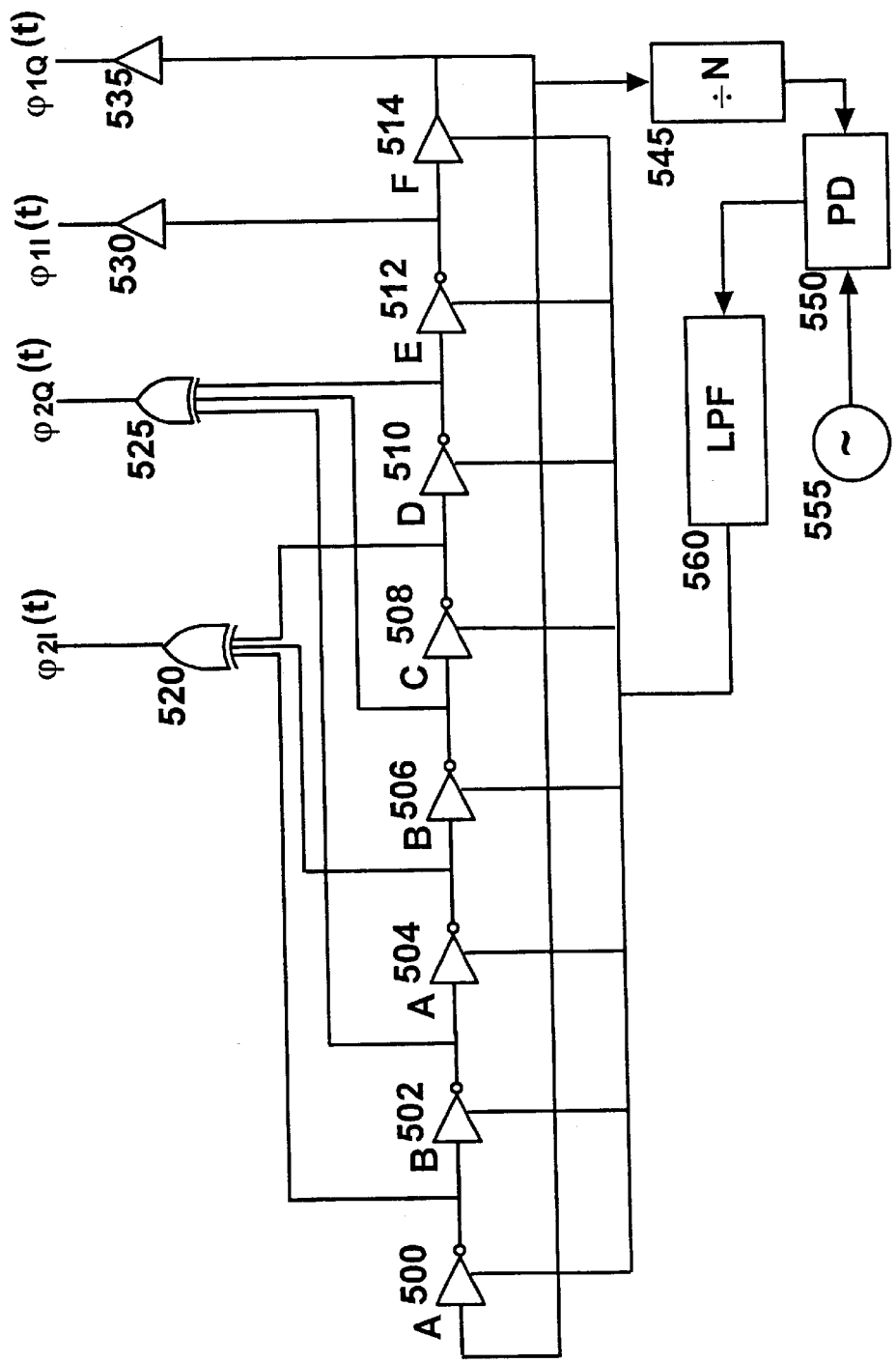
FIG. 5 is a diagram of a further preferred embodiment of the invention.

Turning to FIGS. 3, 4 and 5 we will now describe various preferred embodiments of the invention.

Note that throughout the figures and descriptions, reference is made to amplifier stages which are not balanced. Those skilled in the art would recognise that this is a simplification to assist in the explanation of the invention, and that the use of balanced amplifiers would be typical.

Preferred embodiments of the invention comprise a ring oscillator operatively connected to a number of logical gates arranged to produced the required time-varying signals. As shown in the FIG. 3, a first preferred embodiment of the invention comprises a series of five inverting amplifiers 300, 302, 304, 306, 308, followed by a non-inverting amplifier 310 connected as a ring, the output of each of the first four inverting amplifiers 300, 302, 304, 306 being connected to the input of the next inverting amplifier, the output of the last inverting amplifier 308 being connected to the input of the non-inverting amplifier 310 and the output of the non-inverting amplifier 310 being connected to the input of the first inverting amplifier 300. The output of the fifth inverting amplifier 308 is also connect to a buffer amplifier 330 to produce the time-varying signal $\phi_{1_I}(t)$. The output of the non-inverting amplifier 310 is also connect to another buffer amplifier 335 to produce the time-varying signal $\phi_{2_I}(t)$. The outputs of the first inverting amplifier 300 and the third inverting amplifier 304 are connected to the two inputs of a first two-input exclusive-OR gate 320 to produce a time-varying signal $\phi_{1_Q}(t)$, and the outputs of the second inverting amplifier 302 and the fourth inverting amplifier 306 are connected to the two inputs of a second two-input exclusive-OR gate 325 to produce a time-varying signal $\phi_{2_Q}(t)$. In this case, all of the time-varying signals $\phi_{1_I}(t)$, $\phi_{1_Q}(t)$, $\phi_{2_I}(t)$ and $\phi_{2_Q}(t)$ are square-waves and are used as inputs to various balanced mixers in the associated receiver circuit.

It will be appreciated that the input to the "divide-by-N" circuit 345 can alternatively be fed by the output of any one of the amplifiers 300, 302, 304, 406 or 308 without substantially affecting the nature and performance of the PLL subsystem.

Each of the five inverting amplifiers 300, 302, 304, 306, 308, and the non-inverting amplifier 310 have a delay control input, all of which are connected together and driven by the output of a low-pass filter 360. The input of the low-pass filter (LPF) 360 is driven by the output of a Phase Discriminator (PD) 350 (or phase comparison circuit) whose inputs are the output of a reference Local Oscillator 355 and the output of a 'divide-by-N' (N) circuit 345 driven by the output of the non-inverting amplifier 310, thereby forming a phase locked loop. This Phase Locked Loop (PLL) circuitry provides frequency stability for the ring oscillator by comparing the phase of the signal generated by the ring oscillator with that provided by the local oscillator, in a manner well-understood by those skilled in the art.

By appropriate selection of the outputs of the stages, and the application of simple 'exclusive-OR' (XOR) logic gates, a number of time-varying signals are generated which have the required stable relationships in frequency and phase. FIG. 4 shows the time-varying signals as generated by the circuit of FIG. 3 at various points in the circuit. Referring to both figures, the outputs of the buffer amplifiers 300, 302, 304, 306, 308, 310, are shown as $A_{\phi 1Q}(t)$ 400, B 402, C 404, D 406, E 408 and $F_{\phi 1I}(t)$ 410, and those of the XOR gates 320, 325, are shown as $B \oplus D_{\phi 2I}(t)$ 420 and $C \oplus E_{\phi 2Q}(t)$ 430. The time-varying signals labelled $A_{\phi 1Q}(t)$ 400, $F_{\phi 1I}(t)$ 410, $B \oplus D_{\phi 2I}(t)$ 420 and $C \oplus E_{\phi 2Q}(t)$ 430 bear the necessary relationships to one another to be useful in a modulator or demodulator taking advantage of the principles of a Virtual Local Oscillator.

The delay introduced by each of the buffer amplifiers 300, 302, 304, 306, 308, and 310 which comprise the Ring Oscillator is shown as 'd'. Variation of this delay affects the actual oscillation frequency of the Ring Oscillator and may be used as previously described in the provision of a phase locking arrangement, but their relative differences will affect how closely the signals $\phi_{1Q}(t)$ 400, $F_{\phi 1I}(t)$ 410, $\phi_{2I}(t)$ 420 and $\phi_{2Q}(t)$ 430 emulate the LO of a direct conversion receiver when used in the virtual local oscillator concept. These differences can be minimized through the use of differential amplifier, so that the same amplifier can be used for all sections of the ring oscillator and proper integrated circuit layout techniques to match the loading of each amplifier stage. Inverters 330 and 335 are also used to match the delay of the XORs 320 and 325.

Although the use of the phase locking loop arrangement is included here because the inherent frequency stability of the ring oscillator may not be sufficient for the VLO application, it is not a necessary element of the invention. Other mechanisms may be used to provide the frequency stability required by a particular application of the invention.

Other embodiments of the invention use different combinations of logic to derive time-varying signals which have phase and frequency relationships useful in the implementation of Virtual Local Oscillators for use in modulation and demodulation and like circuits or systems. Embodiments with more stages within the ring of the ring oscillator may be used to derive a lesser or greater number of related time-varying signals using different logic elements arranged to combine various outputs of the stages of the ring oscillator, these logic elements may include, but are not limited to, buffers, 'exclusive-OR' (XOR), 'AND', and, 'OR' gates.

In a second preferred embodiment illustrated in FIG. 5, seven inverting amplifiers 500, 502, 504, 506, 508, 510, 512 and a non-inverting amplifier 514 form the ring oscillator, the outputs of the first 500, third 504 and fifth 508 amplifiers are combined through an XOR gate 520 to generate $\phi_{2I}(t)$, and the outputs of the second 502, fourth 506 and sixth 510 amplifiers are combined through a second XOR gate 525 to generate $\phi_{2Q}(t)$. The outputs of the seventh 512 and eighth 514 stages are buffered 530, 535 to produce $\phi_{1Q}(t)$ and $\phi_{1I}(t)$ respectively. The remaining elements, namely the low-pass filter 560, the Phase Discriminator 550, the reference Local Oscillator 555 and the 'divide-by-N' circuit 545 form the Phase Locked Loop (PLL) circuitry providing frequency stability for the ring oscillator as before.

In further embodiments, I inverting amplifier stages (where I is an odd integer, value five or more) and a single non-inverting amplifier stage arranged as a ring oscillator may be used; the outputs of the odd-numbered stages from 1 to (I−2) are combined using an XOR gate to generate $\phi_{2I}(t)$, the outputs of the even-numbered stages from 2 to (I−1) are combined using a second XOR gate to generate $\phi_{2Q}(t)$, and the output of the Ith inverting amplifier stage and the output of the non-inverting amplifier stage are buffered to generate $\phi_{1Q}(t)$ and $\phi_{1I}(t)$ respectively.

In cases where balanced amplifiers are used more stages can be added to the ring oscillator as long as there is an even number of stages in the oscillator. Outputs-of the-odd stages must be combined to create the inphase φ signals and outputs of the even stages must combined to create to the quadrature φ signals. More than two φ signals may be generated for each of the inphase and quadrature arms if all the φ signals for each arm are added modulo-2 to give a 50% duty cycle square-wave at the RF frequency. Any logic elements can be used to generate the φ signals as long as the delay from all the ring oscillator outputs to the φ outputs is matched well enough that spectrum of all the φ signals added together modulo-2 has a large tone at the RF frequency and does not contain significant power at frequencies other than the RF frequency. In this context, "significant" means "large enough to cause spurious response problems which degrade the overall receiver performance to unacceptable levels".

A person skilled in that art will realise that the invention has application elsewhere, and it is the intention of the inventor that this description covers those situations and applications insofar as they are not already known and in use in the field. A person skilled in the art will realise that the embodiments described may be varied in detail without losing or detracting from the inventive concept described herein, and it is our intention to encompass such variations in design within the description and claims.

What is claimed is:

1. A radio frequency synthesizer system or generating device, of-generating a number of waveforms having an established relationship in phase, frequency and spectral components, suitable for use in a virtual local oscillator block of a homodyne receiver, said generating device comprising:

a ring oscillator comprising J amplifiers (where J is an even integer of value six or more) connected in a serial fashion so that the output of each amplifier drives the input of the next amplifier, and the output of the last amplifier drives the input of the first amplifier;

two combinations of logical gates each combining various outputs of the amplifiers of said ring oscillator to produce waveforms, one combination of gates driven by the outputs of the odd-numbered amplifiers (1, 3, . . . , J-3), a second combination of gates driven by the outputs of the even-numbered amplifiers (2, 4, . . . , J-2), a first non-inverting buffer driven by the output of the amplifier J-1 preceding the last amplifier J, and a second non-inverting buffer driven by the output of the last amplifier J, the two combinations of logical gates being matched for delay and arranged to produce signals such that the output from the odd numbered stages and the output from the even numbered stages bear the relationship required to be suitable for use in a virtual local oscillator block of a homodyne receiver; and means to ensure the frequency of said ring oscillator is stable within the limits required by said virtual local oscillator block.

2. The radio frequency synthesizer system or generating device of claim 1 wherein said amplifiers are balanced amplifiers.

3. The radio frequency synthesizer system or generating device of claim 2 wherein said combinations of logical gates are XOR gates.

4. The radio frequency synthesizer system or generating device, of claim 3 wherein said number of amplifiers is 6.

5. The radio frequency synthesizer system or generating device, of claim 4 wherein the first 5 amplifiers are inverting amplifiers, and the last amplifier is a non-inverting amplifier.

6. A radio frequency synthesizer system or generating device for generating time-varying signals to be input to successive mixers for modulating or demodulating an input signal x(t), suitable for use in a virtual local oscillator block of a homodyne receiver, the generating device comprising:
    a stabilised ring oscillator comprising I (where I is an odd integer) of at least five inverting amplifiers and one non-inverting amplifier connected in a serial fashion so that output of each amplifier drives the input of the next amplifier, and the output of the last amplifier drives the input of the first amplifier; and
    a plurality of combinations of logical gates each combination combining selected outputs of the inverting amplifiers and the non-inverting amplifiers to produce time-varying signals φ1 and φ2, suitable for use in the virtual local oscillator block of a homodyne receiver.

7. The radio frequency synthesizer system or generating device of claim 6 wherein said combinations of logical gates comprise:
    to produce quadrature components of the first time-varying signal φ1:
        a first two-input exclusive-OR gate driven by the outputs of the first and third inverting amplifiers; and
        a second two-input exclusive-OR gate driven by the outputs of the second and fourth inverting amplifiers; and
    to produce quadrature components of the second time-varying signal φ2:
        a first non-inverting buffer driven by the output of the fifth inverting amplifier; and
        a second non-inverting buffer driven by the output of the non-inverting amplifier.

8. The radio frequency synthesizer system or generating device of claim 7 wherein said stabilised ring oscillator includes means to ensure the frequency of the ring oscillator is stable within limits required by the virtual local oscillator application.

9. The radio frequency synthesizer system or generating device of claim 8 wherein said means to ensure the frequency of the ring oscillator is stable comprises a phase locked loop circuit, made operable by; delay controls on each of the inverting amplifiers and on each of the non-inverting amplifiers, a low pass filter driving the delay controls simultaneously, a phase comparison circuit driving the low pass filter, the phase comparison circuit having as inputs the output of a "divide-by-N" circuit and a reference oscillator, the "divide-by-N" circuit having as input the output of any one of the inverting amplifiers or any one of the non-inverting amplifiers.

10. The radio frequency synthesizer system or generating device of claim 6 wherein said ring oscillator comprises a configuration of seven inverting amplifiers connected in a serial fashion followed by a single non-inverting amplifier as the last amplifier, connected in turn to the first amplifier.

11. The radio frequency synthesizer system or generating device of claim 10 wherein said combinations of logical gates comprise:
    to produce quadrature components of the first time-varying signal φ1:
        a first three-input exclusive-OR gate driven by the outputs of the first, third and fifth inverting amplifiers; and
        a second two-input exclusive-OR gate driven by the outputs of the second, fourth and sixth inverting amplifiers; and
    to produce quadrature components of the second time-varying signal φ2:
        a first non-inverting buffer driven by the output of the seventh inverting amplifier; and
        a second non-inverting buffer driven by the output of the non-inverting amplifier.

12. The radio frequency synthesizer system or generating device of claim 11 wherein said stabilised ring oscillator includes means to ensure the frequency of the ring oscillator is stable within the limits required by the virtual local oscillator application.

13. The radio frequency synthesizer system or generating device of claim 12 wherein said means to ensure the frequency of the ring oscillator is stable comprises a phase locked loop circuit, made operable by: delay controls on each of the inverting amplifiers and on each of the non-inverting amplifiers, a low pass filter driving the delay controls simultaneously, a phase comparison circuit driving the low pass filter, the phase comparison circuit having as inputs the output of a "divide-by-N" circuit and a reference oscillator, the "divide-by-N" circuit having as input the output of any one of the inverting amplifiers or or the output of the non-inverting amplifiers.

14. A radio frequency synthesizer system or generating device, of generating a number of waveforms having an established relationship in phase, frequency and spectral components, suitable for use in a virtual local oscillator block of a homodyne receiver, the generating device comprising:
    a ring oscillator comprising I (where I is an odd integer of value five or more) inverting amplifiers followed by a single non-inverting amplifier as the last amplifier, connected in a serial fashion so that the output of each amplifier drives the input of the next amplifier, and the output of the non-inverting (last) amplifier drives the input of the first amplifier;
    a number of combinations of logical gates each combining various outputs of the inverting amplifiers and non-inverting amplifier of the ring oscillator to produce waveforms, namely an exclusive-OR gate driven by the outputs of the odd-numbered inverting amplifiers (1, 3, . . . , I-2), a second exclusive-OR gate driven by the outputs of the even-numbered inverting amplifiers (2, 4, . . . , I-1), a first non-inverting buffer driven by the output of the inverting amplifier I preceding the non-inverting (last) amplifier, and a second non-inverting buffer driven by the output of the non-inverting (last) amplifier; and
    means to ensure the frequency of the ring oscillator is stable within the limits required by the virtual local oscillator application.

15. A method for generating time-varying signals to be input to successive mixers for modulating or demodulating an input signal x(t), suitable for use in a virtual local oscillator block of a homodyne receiver, the method comprising the steps of:
    generating a plurality of signals using a stabilised ring oscillator comprising I (where I is an odd integer of value five or more) inverting amplifiers and one non-inverting amplifier connected in a serial fashion so that output of each amplifier drives the input of the next amplifier, and the output of the non-inverting (last) amplifier drives the input of the first inverting amplifier, said plurality of signals being the outputs of all of said inverting amplifiers and said non-inverting amplifier within said stabilised ring oscillator; and combining said plurality of signals using a plurality of logical gate combinations to produce time-varying signals φ1 and φ2, suitable for use in a virtual local oscillator block of a homodyne receiver.

16. A computer readable memory medium, storing computer software code in a hardware development language for fabrication of an integrated circuit comprising a radio frequency synthesizer or generating device, generating a number of waveforms having an established relationship in phase, frequency and spectral components, suitable for use in a virtual local oscillator block of a homodyne receiver, said generating device comprising:

a ring oscillator comprising J amplifiers (where J is an even integer of value six or more) connected in a serial fashion so that the output of each amplifier drives the input of the next amplifier, and the output of the last amplifier drives the input of the first amplifier;

two combinations of logical gates each combining various outputs of the amplifiers of said ring oscillator to produce waveforms, one combination of gates driven by the outputs of the odd-numbered amplifiers (1, 3, ..., J-3), a second combination of gates driven by the outputs of the even-numbered amplifiers (2, 4, ..., J-2), a first non-inverting buffer driven by the output of the amplifier J-1 preceding the last amplifier J, and a second non-inverting buffer driven by the output of the last amplifier J, the two combinations of logical gates being matched for delay and arranged to produce signals such that the output from the odd numbered stages and the output from the even numbered stages bear the relationship required to be suitable for use in a virtual local oscillator block of a homodyne receiver; and means to ensure the frequency of said ring oscillator is stable within the limits required by said virtual local oscillator block.

17. A computer readable memory medium, storing computer software code in a hardware development language for fabrication of an integrated circuit comprising the a radio frequency synthesizer or generating device for generating time-varying signals to be input to successive mixers for modulating or demodulating an input signal x(t), suitable for use in a virtual local oscillator block of a homodyne receiver, the generating device comprising:

a stabilised ring oscillator comprising I (where I is an odd integer) of at least five inverting amplifiers and one non-inverting amplifier connected in a serial fashion so that output of each amplifier drives the input of the next amplifier, and the output of the last amplifier drives the input of the first amplifier: and a plurality of combinations of logical gates each combination combining selected outputs of the inverting amplifiers and the non-inverting amplifiers to produce time-varying signals φ1 and φ2, suitable for use in the virtual local oscillator block of a homodyne receiver.

* * * * *